US008882431B2

(12) United States Patent  
Hashimoto (10) Patent No.: US 8,882,431 B2  
(45) Date of Patent: Nov. 11, 2014

(54) SUBSTRATE TRANSFER ROBOT AND SUBSTRATE TRANSFER SYSTEM (75) Inventor: Yasuhiko Hashimoto, Kobe (JP)

(73) Assignee: Kawasaki Jukogyo Kabushiki Kaisha, Kobe-Shi (JP)

( * ) Notice: Subject to any disclaimer, the term of this patent is extended or adjusted under 35 U.S.C. 154(b) by 654 days.

(21) Appl. No.: 13/121,518

(22) PCT Filed: Sep. 28, 2009

(86) PCT No.: PCT/JP2009/066751  
§ 371 (c)(1),  
(2), (4) Date: Mar. 29, 2011

(87) PCT Pub. No.: WO2010/041562  
PCT Pub. Date: Apr. 15, 2010

(65) Prior Publication Data  
US 2011/0182702 A1 Jul. 28, 2011

(30) Foreign Application Priority Data

Oct. 7, 2008 (JP) ................................ 2008-260748  
Oct. 7, 2008 (JP) ................................ 2008-260764

(51) Int. Cl.  
H01L 21/67 (2006.01)  
B25J 9/10 (2006.01)  
B25J 9/04 (2006.01)  
H01L 21/677 (2006.01)

(52) U.S. Cl.  
CPC ...... B25J 9/041 (2013.01); B25J 9/104 (2013.01); H01L 21/67745 (2013.01); H01L 21/67742 (2013.01)  
USPC .................. 414/226.05; 414/222.07

(58) Field of Classification Search  
CPC ........... B25J 5/005; B25J 5/02; B25J 9/0093; B25J 9/04; B25J 9/041; B25J 15/0019; B25J 18/02; B65G 47/90; B65G 47/901; B65G 47/902; B65G 49/07; H01L 21/67; H01L 21/67005; H01L 21/677; H01L 21/6703; H01L 21/67706; H01L 21/67724; H01L 21/67736; H01L 21/67739; H01L 21/67742; H01L 21/67748; H01L 21/67751; H01L 21/67763; H01L 21/67766; H01L 21/67769; H01L 21/67778  
USPC ............. 198/346.1, 346.2; 414/217, 222.07, 414/222.08, 222.12, 222.13, 226.05, 283, 414/416.05, 416.06, 416.08, 589, 590, 414/744.1, 744.2, 744.3, 744.6, 744.7, 414/751.1, 806, 807, 808, 935, 937, 939, 414/941; 901/7, 16, 21, 36  
See application file for complete search history.

(56) References Cited

U.S. PATENT DOCUMENTS 4,391,360 A * 7/1983 Minnetti ................. 198/412  
4,678,390 A * 7/1987 Bonneton et al. ............. 414/282

(Continued)

FOREIGN PATENT DOCUMENTS

JP A-3-284534 12/1991  
JP A-5-39194 2/1993

(Continued)

OTHER PUBLICATIONS

Mar. 15, 2012 European Search Report issued in European Patent Application No. 09819097.8.

(Continued)

Primary Examiner — Saul Rodriguez  
Assistant Examiner — Brendan Tighe  
(74) Attorney, Agent, or Firm — Oliff PLC (57) ABSTRACT A robot that includes an end effector for holding a substrate in a substantially horizontal state; a vertical driving unit for driving the end effector to move in a vertical direction; a horizontal driving unit for driving the vertical driving unit to move in a horizontal direction; and a rotation driving unit for rotating the horizontal driving unit about a rotation axis extending in the vertical direction. In this case, one end of the end effector is connected with the vertical driving unit. One end of the vertical driving unit is connected with the horizontal driving unit.

5 Claims, 6 Drawing Sheets

(56) References Cited

U.S. PATENT DOCUMENTS

| | | | |
|---|---|---|---|
| 5,306,380 A * | 4/1994 | Hiroki | 156/345.32 |
| 5,423,503 A * | 6/1995 | Tanaka et al. | 248/277.1 |
| 5,445,486 A * | 8/1995 | Kitayama et al. | 414/416.03 |
| 5,613,821 A * | 3/1997 | Muka et al. | 414/217.1 |
| 5,615,988 A * | 4/1997 | Wiesler et al. | 414/416.03 |
| 5,636,960 A * | 6/1997 | Hiroki et al. | 414/781 |
| 5,655,871 A * | 8/1997 | Ishii et al. | 414/416.02 |
| 5,716,187 A * | 2/1998 | Costa | 414/751.1 |
| 5,788,868 A * | 8/1998 | Itaba et al. | 216/41 |
| 5,803,932 A | 9/1998 | Akimoto et al. | |
| 5,813,819 A * | 9/1998 | Ohsawa et al. | 414/416.08 |
| 5,873,214 A * | 2/1999 | Moore et al. | 53/399 |
| 5,915,910 A * | 6/1999 | Howells et al. | 414/331.17 |
| 5,963,753 A * | 10/1999 | Ohtani et al. | 396/611 |
| 5,980,195 A * | 11/1999 | Miyashita | 414/783 |
| 6,132,160 A * | 10/2000 | Iwai | 414/416.03 |
| 6,158,946 A * | 12/2000 | Miyashita | 414/411 |
| 6,203,268 B1 | 3/2001 | Miyashita | 414/757 |
| 6,371,717 B1 * | 4/2002 | Grams et al. | 414/416.09 |
| 6,390,754 B2 * | 5/2002 | Yamaga et al. | 414/217 |
| 6,467,186 B2 * | 10/2002 | Kato et al. | 34/92 |
| 6,484,414 B2 * | 11/2002 | Kato et al. | 34/92 |
| 6,766,996 B1 * | 7/2004 | Somers | 248/650 |
| 6,851,872 B1 * | 2/2005 | Okubo et al. | 396/611 |
| 6,888,343 B1 * | 5/2005 | Holt et al. | 324/750.22 |
| 6,911,816 B2 * | 6/2005 | Holt et al. | 324/756.01 |
| 7,245,118 B2 * | 7/2007 | Holt et al. | 324/750.22 |
| 7,260,448 B2 * | 8/2007 | Goto et al. | 700/218 |
| 7,296,673 B2 * | 11/2007 | Blonigen et al. | 198/369.6 |
| 7,438,175 B2 * | 10/2008 | White et al. | 198/346.2 |
| 7,445,689 B2 * | 11/2008 | Yoshida et al. | 156/345.24 |
| 7,597,109 B2 * | 10/2009 | Lee | 134/140 |
| 7,648,018 B2 * | 1/2010 | Inui | 198/463.3 |
| 7,665,950 B2 * | 2/2010 | Uratani et al. | 414/744.2 |
| 7,670,555 B2 * | 3/2010 | Hoover et al. | 422/65 |
| 7,868,270 B2 * | 1/2011 | Ookura et al. | 219/448.11 |
| 7,975,376 B2 * | 7/2011 | Hirano et al. | 29/825 |
| 7,981,217 B2 * | 7/2011 | Hagihara | 118/719 |
| 8,029,224 B2 * | 10/2011 | Abe et al. | 414/217 |
| 8,151,852 B2 * | 4/2012 | Zuniga et al. | 156/382 |
| 8,177,550 B2 * | 5/2012 | Haraki et al. | 432/239 |
| 8,309,374 B2 * | 11/2012 | Porthouse et al. | 438/19 |
| 8,328,940 B2 * | 12/2012 | Choi et al. | 118/719 |
| 8,366,872 B2 * | 2/2013 | Tsutsumi et al. | 156/345.51 |
| 8,423,175 B2 * | 4/2013 | Abe et al. | 700/214 |
| 8,449,678 B2 * | 5/2013 | Endo et al. | 118/719 |
| 8,499,430 B2 * | 8/2013 | Yamada et al. | 29/428 |
| 2001/0014267 A1 * | 8/2001 | Yamaga et al. | 414/217 |
| 2004/0091343 A1 * | 5/2004 | Astegno et al. | 414/416.08 |
| 2005/0040812 A1 * | 2/2005 | Holt et al. | 324/158.1 |
| 2005/0052176 A1 * | 3/2005 | Holt et al. | 324/158.1 |
| 2005/0123383 A1 * | 6/2005 | Goto et al. | 414/416.08 |
| 2006/0183240 A1 * | 8/2006 | Taniyama | 436/151 |
| 2008/0260502 A1 * | 10/2008 | Aburatani | 414/226.04 |
| 2008/0279656 A1 * | 11/2008 | Uratani et al. | 414/217 |
| 2009/0087285 A1 * | 4/2009 | Mitsuyoshi | 414/217 |
| 2009/0162172 A1 * | 6/2009 | Miyamoto | 414/226.01 |
| 2009/0185892 A1 * | 7/2009 | Aburatani | 414/806 |
| 2009/0247053 A1 * | 10/2009 | Lee | 451/11 |
| 2010/0061828 A1 * | 3/2010 | Asari et al. | 414/160 |
| 2010/0249993 A1 * | 9/2010 | Mitsuyoshi | 700/228 |
| 2011/0027049 A1 * | 2/2011 | Yamada | 414/172 |
| 2011/0027058 A1 * | 2/2011 | Yamada et al. | 414/751.1 |
| 2011/0078898 A1 * | 4/2011 | Ishida et al. | 29/771 |
| 2011/0150608 A1 * | 6/2011 | Choi et al. | 414/222.01 |
| 2011/0153062 A1 * | 6/2011 | Hong et al. | 700/218 |
| 2011/0182699 A1 * | 7/2011 | Kurita et al. | 414/172 |
| 2011/0182702 A1 * | 7/2011 | Hashimoto | 414/222.07 |
| 2011/0240597 A1 * | 10/2011 | Tsutsumi et al. | 216/41 |
| 2011/0245957 A1 * | 10/2011 | Porthouse et al. | 700/114 |
| 2011/0265725 A1 * | 11/2011 | Tsuji et al. | 118/725 |
| 2011/0308458 A1 * | 12/2011 | Sung et al. | 118/719 |
| 2012/0072010 A1 * | 3/2012 | Yamada | 700/213 |
| 2013/0170935 A1 * | 7/2013 | Kato et al. | 414/744.3 |
| 2013/0238113 A1 * | 9/2013 | Kawasaki et al. | 700/121 |

FOREIGN PATENT DOCUMENTS

| | | |
|---|---|---|
| JP | A-7-297258 | 11/1995 |
| JP | A-9-11161 | 1/1997 |
| JP | A-2001-274218 | 10/2001 |
| JP | A-2007-54939 | 3/2007 |
| JP | A-2007-260862 | 10/2007 |
| JP | A-2008-53643 | 3/2008 |
| JP | A-2008-73788 | 4/2008 |
| JP | A-2008-137115 | 6/2008 |

OTHER PUBLICATIONS

International Preliminary Report on Patentability issued May 17, 2011 in International Patent Application No. PCT/JP2009/066751 (with translation).

International Search Report dated Nov. 10, 2009 in corresponding International Application No. PCT/JP2009/066751 (with translation).

Jul. 9, 2013 Office Action issued in Japanese Patent Application No. 2008-260748 (with translation).

* cited by examiner

SUBSTRATE TRANSFER ROBOT AND SUBSTRATE TRANSFER SYSTEM

TECHNICAL FIELD

The present invention relates to a robot adapted for transferring substrates, and a substrate transfer system provided with the robot. In particular, this substrate transfer robot or system is suitable for transferring heavy substrates, such as large-sized glass substrates for use in solar panels, or the like.

BACKGROUND ART

Today, for substrate processing machines, such as a chemical vapor deposition (CVD) machine or the like, various robots are used for transferring substrates to be processed and/or substrates which have already processed.

As one example of the substrate to be processed by such a substrate processing machine, a square-shaped glass substrate for use in the solar panel has been known. Generally, this glass substrate is sized to have a 2 m side, and is hence considerably heavy and large-sized.

In order to transfer safely and securely such a large-sized glass substrate for use in the solar panel or the like, it is necessary to provide the robot that can be adequately accommodated to such a heavy weight of the substrate.

In addition, in order to install the substrate transfer system in a limited space or area, it is necessary to downsize the system as small as possible.

RELATED ART REFERENCES

Patent Documents

Patent Document 1: JP2008-137115A
Patent Document 2: JP2008-73788A
Patent Document 3: JP2007-260862A
Patent Document 4: JP2007-54939A However, in the above conventional substrate transfer robot, when the substrate is lifted together with an end effector of the robot, an arm or the like part, to which the end effector is attached, is lifted together with the end effector holding the substrate.

Therefore, in order to lift safely and securely such a heavy and large-sized glass substrate having a side longer than 2 m, it is necessary to provide a motor of a considerably large capacity as a driving source, thus leading to substantial increase of the size and production cost of the entire system.

In addition to such a problem that may tend to substantially increase the size of the conventional substrate transfer robot, the current demand for possibly preventing unwanted interference between each substrate and the arm or the like part makes it rather difficult to employ an adequately compact layout upon arrangement of the substrate processing machine and the like around the robot.

Furthermore, the aforementioned conventional substrate transfer robot is designed to have the arm that is extended in the horizontal direction when the end effector is moved in the horizontal direction. This structure may tend to cause some undesired positional shift of the end effector attributable to bending due to the weight of such an extended arm.

DISCLOSURE OF THE INVENTION

The present invention was made in light of the above circumstances. Therefore, it is an object of this invention to provide a substrate transfer robot and a substrate transfer system including this robot, respectively configured for possibly preventing the unwanted increase of the size of the entire structure, as well as for achieving significantly safe and secure carriage for considerably heavy articles, such as the large-sized glass substrate.

Another object of this invention is to provide a substrate transfer robot and a substrate transfer system including this robot that can enable a significantly compact layout of the arrangement of the substrate processing machine and the like around the substrate transfer robot to be adopted.

In order to achieve the above object, the substrate transfer robot of this invention includes: an end effector configured to hold a substrate in a substantially horizontal state; a vertical driving unit configured to drive the end effector to move in a vertical direction; a horizontal driving unit configured to drive the vertical driving unit to move in a horizontal direction; and a rotation driving unit configured to rotate the horizontal driving unit about a rotation axis extending in the vertical direction, wherein one end of the end effector is connected with the vertical driving unit, and wherein one end of the vertical driving unit is connected with the horizontal driving unit.

Preferably, the horizontal driving unit includes a travel support member extending in the horizontal direction, the travel support member having a front end and a rear end and being configured to be rotated about the rotation axis by the rotation driving unit, and a travel driving mechanism configured to drive the vertical driving unit to travel between the front end and the rear end of the travel support member.

Preferably, the travel driving mechanism includes a horizontal transfer belt provided across the front end and the rear end of the travel support member, a bottom end of the vertical driving unit being fixedly attached to the horizontal transfer belt, and a horizontal transfer motor configured to drive the horizontal transfer belt.

Preferably, the vertical driving unit includes a lifting support member extending in the vertical direction and having a top end and a bottom end, the bottom end of the lifting support member being attached to the horizontal driving unit, and a lifting driving mechanism configured to lift the end effector between the top end and the bottom end of the lifting support member.

Preferably, the lifting driving mechanism includes a vertical transfer belt provided across the top end and the bottom end of the lifting support member, a proximal end of the end effector being fixedly attached to the vertical transfer belt, and a vertical transfer motor configured to drive the vertical transfer belt.

Preferably, the end effector extends in the horizontal direction and has a proximal end and a distal end, the proximal end of the end effector being attached to the vertical driving unit. When the vertical driving unit is positioned at a rear end of the horizontal driving unit, the distal end of the end effector is positioned on a rear end side relative to a front end of the horizontal driving unit.

Preferably, the rotation axis is positioned nearer to a rear end of the horizontal driving unit than a central position thereof in a longitudinal direction of the horizontal driving unit.

Further, in order to achieve the above object, the substrate transfer system of this invention includes: the substrate transfer robot according to claim 1 configured to transfer the substrate to/from a substrate processing machine located adjacent to the robot for processing the substrate; and a substrate carrying in/out unit located adjacent to the robot and configured to carry in the substrate to a position near the robot as well as carry out the substrate received from the robot.

Preferably, the substrate transfer system further includes a temporary storage unit located adjacent to the robot and configured to temporarily store therein the substrate transferred by the robot between the substrate carrying in/out unit and the substrate processing machine.

Preferably, the end effector extends in the horizontal direction and has a proximal end and a distal end, the proximal end of the end effector being attached to the vertical driving unit. The robot is configured such that when the vertical driving unit is positioned at a rear end of the horizontal driving unit, the distal end of the end effector is positioned on a rear end side relative to a front end of the horizontal driving unit. An opened space, which is opened at least on a side facing the robot, is provided in a lower portion of at least one of the substrate processing machine and the temporary storage unit. The robot is positioned such that when the horizontal driving unit is rotated about the rotation axis, the front end of the horizontal driving unit passes through at least one opened space.

Preferably, the substrate processing machine and the substrate carrying in/out unit are arranged to be opposed relative to each other with the robot being positioned therebetween. The temporary storage unit is positioned on a line orthogonal to a line defined between the substrate processing machine and the substrate carrying in/out unit.

Preferably, a pair of temporary storage units are arranged to be opposed relative to each other with the robot being positioned therebetween.

Preferably, the rotation axis is positioned nearer to a rear end of the horizontal driving unit than a central position thereof in a longitudinal direction of the horizontal driving unit.

Preferably, the horizontal driving unit includes a travel support member extending in the horizontal direction, the travel support member having a front end and a rear end and being configured to be rotated about the rotation axis by the rotation driving unit, and a travel driving mechanism configured to drive the vertical driving unit to travel between the front end and the rear end of the travel support member. The travel driving mechanism includes a horizontal transfer belt provided across the front end and the rear end of the travel support member, a bottom end of the vertical driving unit being fixedly attached to the horizontal transfer belt, and a horizontal transfer motor configured to drive the horizontal transfer belt.

Preferably, the vertical driving unit includes a lifting support member extending in the vertical direction and having a top end and a bottom end, the bottom end of the lifting support member being attached to the horizontal driving unit, and a lifting driving mechanism configured to lift the end effector between the top end and the bottom end of the lifting support member. The lifting driving mechanism includes a vertical transfer belt provided across the top end and the bottom end of the lifting support member, a proximal end of the end effector being fixedly attached to the vertical transfer belt, and a vertical transfer motor configured to drive the vertical transfer belt.

BRIEF DESCRIPTION OF THE DRAWINGS

FIG. 4 is a diagram for illustrating opened spaces respectively provided in the substrate processing machine, the temporary storage unit and a conveyor, in which FIG. 4(a) shows the temporary storage unit, FIG. 4(b) shows the substrate processing machine, and FIG. 4(C) shows the conveyor.

FIG. 5 is a diagram for illustrating one layout of the substrate transfer system and the substrate processing machine, respectively shown in FIG. 1, in which FIG. 5(a) is a partial plan view of the layout, and FIG. 5(b) is a partial side view of the layout.

MODE FOR CARRYING OUT THE INVENTION

Hereinafter, the substrate transfer robot and the substrate transfer system including this robot, respectively according to one exemplary embodiment of the present invention, will be described with reference to the drawings.

Figure 1:
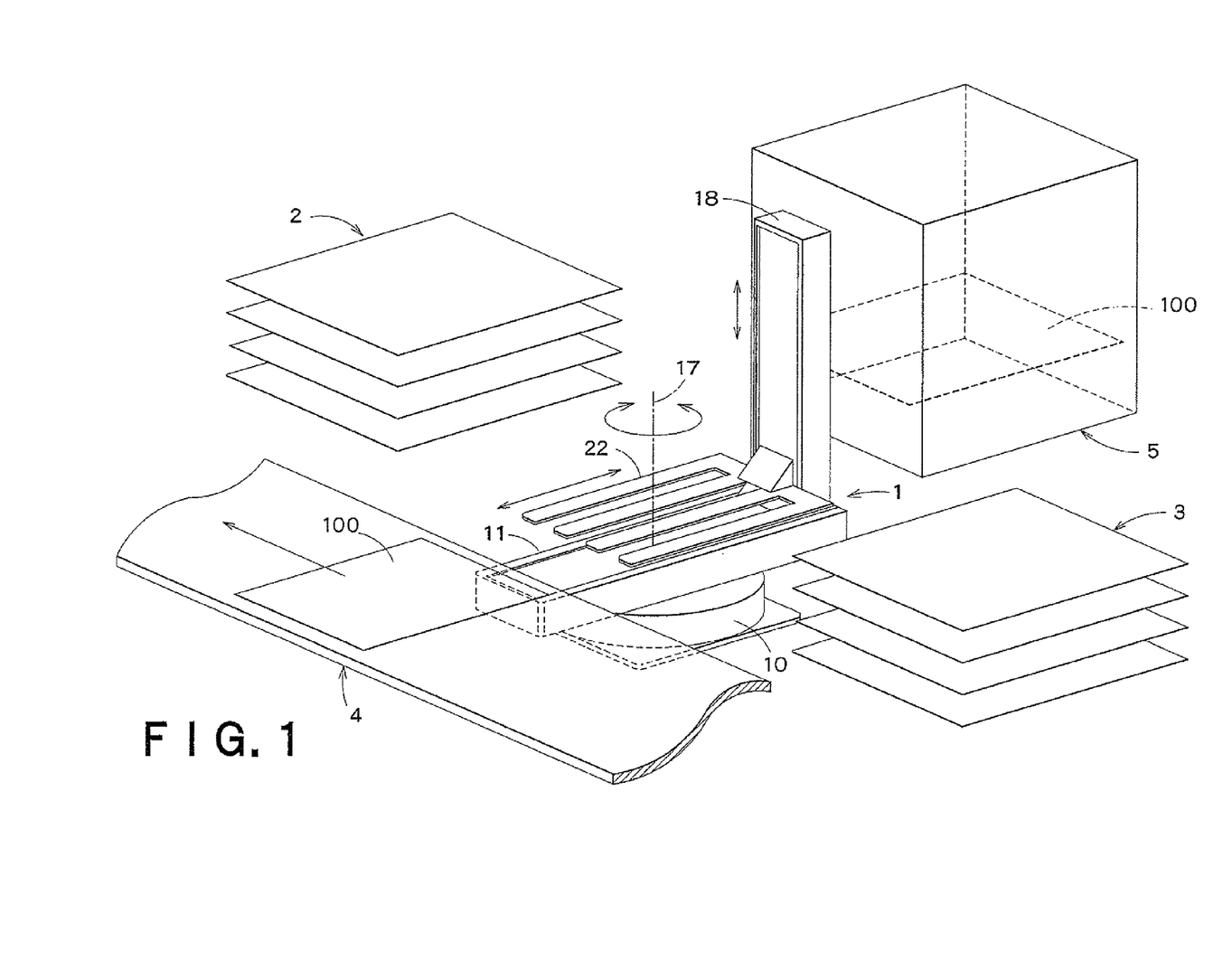
FIG. 1 is a perspective view provided for schematically showing the construction of the substrate transfer system including the substrate transfer robot according to an embodiment of the present invention, in which the substrate processing machine is also depicted.
Figure 2:
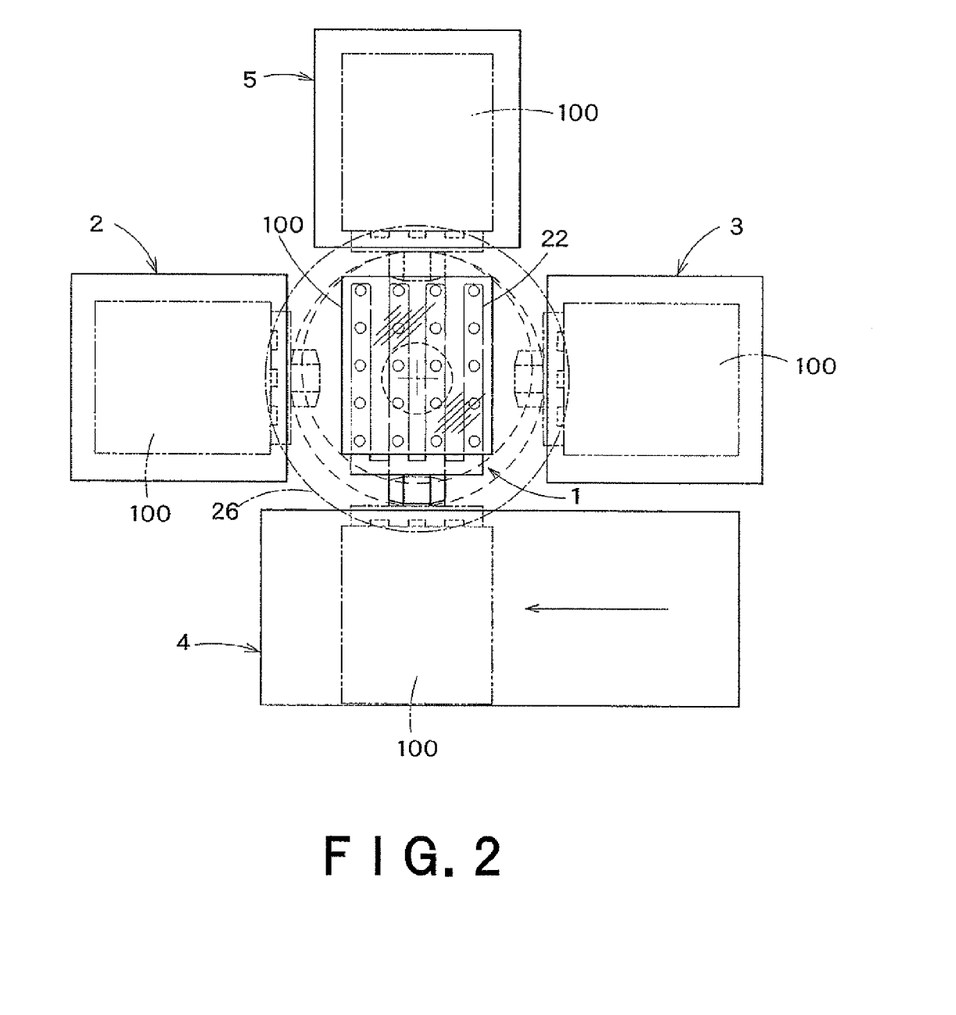
FIG. 2 is a plan view of the substrate transfer system and the substrate processing machine, respectively shown in FIG. 1.

As shown in FIGS. 1 and 2, the substrate transfer system includes the substrate transfer robot 1, a pair of temporary storage units 2, 3 and a conveyor 4, respectively arranged around the robot 1. In addition, the substrate processing machine 5 adapted for processing the substrates is located adjacent to the robot 1.

In this substrate transfer system, the substrate processing machine 5 and the conveyor 4 are arranged to be opposed relative to each other with the robot 1 being interposed therebetween. Further, the pair of temporary storage units 2, 3 are arranged to be opposed relative to each other with the robot 1 being interposed therebetween on one line orthogonal to another line defined between the substrate processing machine 5 and the conveyor 4.

In particular, this transfer system is suitable for transferring the large-sized glass substrate 100 for use in the solar panel, wherein the robot 1 can be optionally moved to transfer the glass substrate 100, among the conveyor 4, the pair of temporary storage units 2, 3 and the substrate processing machine 5.

For instance, when one glass substrate 100 (that is not yet processed) is carried to a point in the vicinity of the robot 1 by the conveyor 4, this glass substrate 100 can be transferred by the robot 1 to the first temporary storage unit 2. Then, such an unprocessed glass substrate 100 temporarily stored in the first temporary storage unit 2 will be further transferred by the robot 1 to the substrate processing machine 5.

Thereafter, the substrate processing machine 5 provides chemical vapor deposition (CVD) or the like process to each glass substrate 100. Then, each of such processed glass substrates 100 will be transferred by the robot 1 from the substrate processing machine 5 toward the second temporary storage unit 3.

Thereafter, each processed glass substrate 100 temporarily stored in the second temporary storage unit 3 will be further transferred to the conveyor 4 by the robot 1, and then carried out by the conveyor 4.

Figure 3:
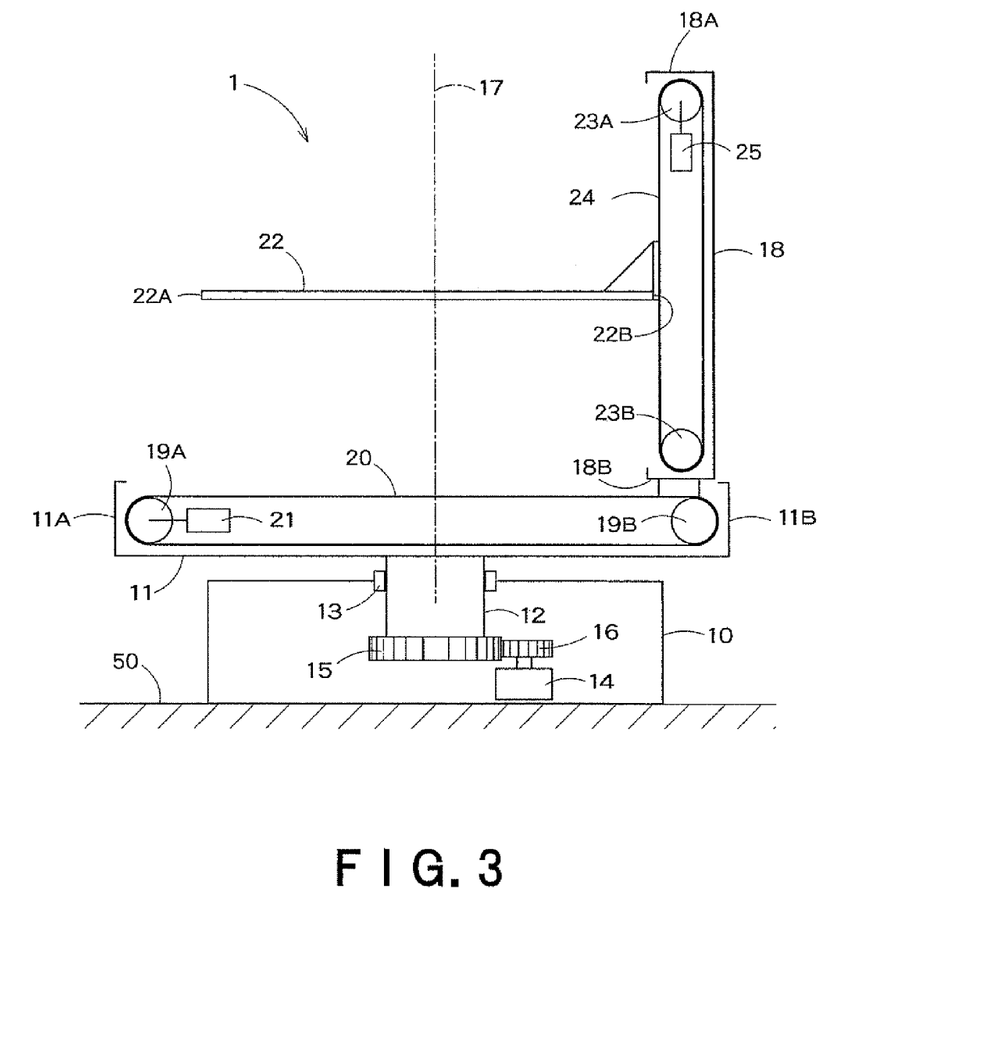
FIG. 3 is a vertical cross section schematically showing the substrate transfer robot according to the embodiment of the present invention.

As shown in FIG. 3, the substrate transfer robot 1 includes a base 10 fixed in position to a floor 50. This base 10 is configured for supporting thereon an elongated travel support member 11 extending in the horizontal direction, such that this travel support member 11 can be optionally rotated.

More specifically, a rotation shaft 12 is fixed in position to a bottom face of the travel support member 11, such that this shaft 12 can be optionally pivoted relative to a bearing 13 of the base 10. In this embodiment, the rotation shaft 12 is located slightly near a rear end 11B of the travel support member 11 relative to a central position in the longitudinal direction of the travel support member 11.

Further, a servomotor 14 including an encoder is provided in the base 10. With this configuration, the rotation driving force of the servomotor 14 can be transmitted to the rotation shaft 12 via two gear mechanisms 15, 16. Thus, the travel support member 11 can be rotated about the rotation axis 17 extending in the vertical direction relative to the base 10. Namely, in this case, the servomotor 14 and two gear mechanisms 15, 16 constitute together one rotation driving mechanism.

Further, the lifting support member 18 extending in the vertical direction is attached to the travel support member 11, such that this lifting support member 18 can be moved between the front end 11A and the rear end 11B of the travel support member 11, while maintaining its vertically standing position.

More specifically, the horizontal transfer belt 20 is arranged in an inner space of the travel support member 11, while being provided across a pair of pulleys (horizontal transfer pulleys) 19A, 19B, between the front end 11A and the rear end 11B of the travel support member 11. A top face of the travel support member 11 is opened with the bottom end 18B of the lifting support member 18 being fixed in position to a top face of the horizontal transfer belt 20. It is noted that the opened portion of the top face of the travel support member 11 may be sealed with a proper sealing belt or the like.

In this embodiment, one pulley 19A can be rotated by a servomotor 21 including the encoder, thereby optionally driving the horizontal transfer belt 20 in either of forward and backward directions. Thus, the lifting support member 18 can be moved between the front end 11A and the rear end 11B of the travel support member 11. Namely, the servomotor 21, the horizontal transfer belt 20 and two pulleys 19A, 19B constitute together one travel driving mechanism configured to drive the lifting support member 18 to travel in the horizontal direction. Further, this travel driving mechanism and the travel support member 11 constitute together one horizontal driving unit.

Again, as shown in FIG. 3, the end effector 22 extending in the horizontal direction is attached to a front face of the lifting support member 18, such that this end effector 22 can be lifted between the top end 18A and the bottom end 18B of the lifting support member 18, while maintaining its horizontally extending position.

More specifically, a vertical transfer belt 24 is arranged in an inner space of the lifting support member 18, while being provided across a pair of pulleys (vertical transfer pulleys) 23A, 23B, between the top end 18A and the bottom end 18B of the lifting support member 18. The front face of the lifting support member 18 is opened with the proximal end 22B of the end effector 22 being fixed in position to a front face of the vertical transfer belt 24. It is noted that the opened portion of the front face of the lifting support member 18 may be sealed with the sealing belt or the like.

One pulley 23A can be rotated by a servomotor 25 including the encoder, thereby optionally driving the vertical transfer belt 24 in either of upward and downward directions. As such, the end effector 22 can be moved between the top end 18A and the bottom end 18B of the lifting support member 18. Namely, the servomotor 25, the vertical transfer belt 24 and two pulleys 23A, 23B constitute together one lifting driving mechanism adapted for lifting the end effector 22 in the vertical direction. Further, this lifting driving mechanism and the lifting support member 18 constitute together one vertical driving unit.

FIG. 3 shows the lifting support member 18 taking a position at the rear end 11B of the travel support member 11. In this waiting position, the distal end 22A of the end effector 22 is positioned on the rear end side of the travel support member 11 relative to the front end of the travel support member 11.

In a lower portion of each temporary storage unit 2A, 3A of this substrate transfer system, as shown in FIG. 4(a), the opened space 2A, 3A that is opened at least on its one side facing the robot 1 (i.e., on the front face side thereof) is provided.

Further, in a lower portion of the substrate processing machine 5, as shown in FIG. 4(b), another opened space 5A that is opened at least on its one side facing the robot 1 (i.e., on the front face side thereof) is provided. Rather than providing such an opened space 5A in the lower portion of the substrate processing machine 5, the substrate processing machine 5 may be located in a suitable position that can adequately prevent unwanted interference with the so-called minimum turning radius of the robot 1.

Additionally, in an area defined between upper and lower belts of the conveyor 4, as shown in FIG. 4(c), still another opened space 4A that is opened at least on its one side facing the robot 1 (i.e., on the front face side thereof) is provided.

When the travel support member 11 of the robot 1 is rotated about the rotation axis 17, the front end 11A of the travel support member 11 describes a circular locus as denoted by reference numeral 26 in FIG. 2.

In this case, as shown in FIG. 2, the circular locus 26 described by the front end 11A of the travel support member 11 is partly overlapped with each area of the temporary storage units 2, 3, the conveyor 4 and the substrate processing machine 5. In some cases, however, the substrate processing machine 5 may be located to avoid such an overlap with the circular locus 26.

Figure 4:
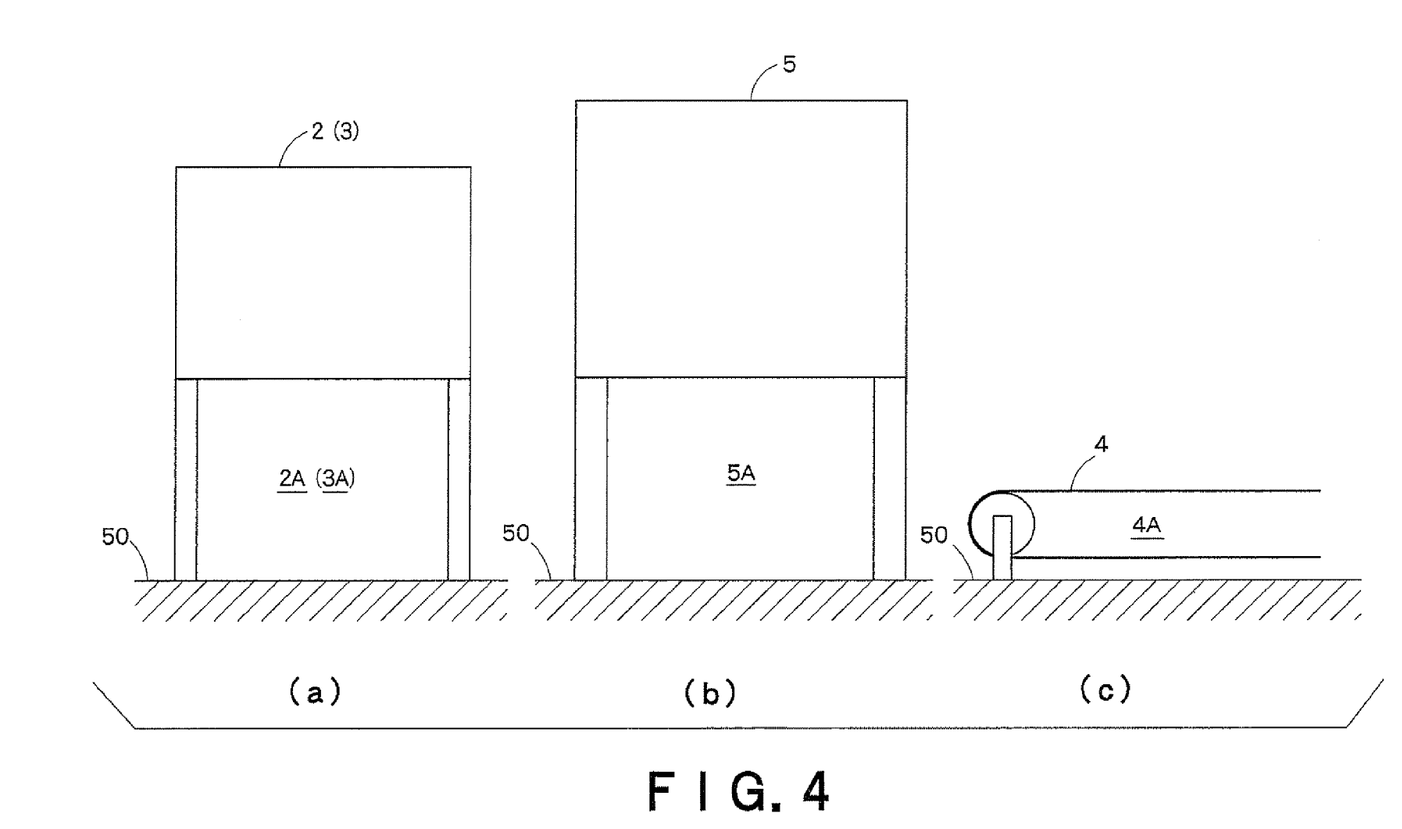

In this case, however, since the opened spaces 2A, 2B, 4A, 5A are respectively provided, as shown in FIG. 4, to each corresponding unit or component, the travel support member 11 of the robot 1 can be rotated with the distal end 11A thereof passing through each of such opened spaces 2A, 2B, 4A, 5A, without any interference.

Figure 5:
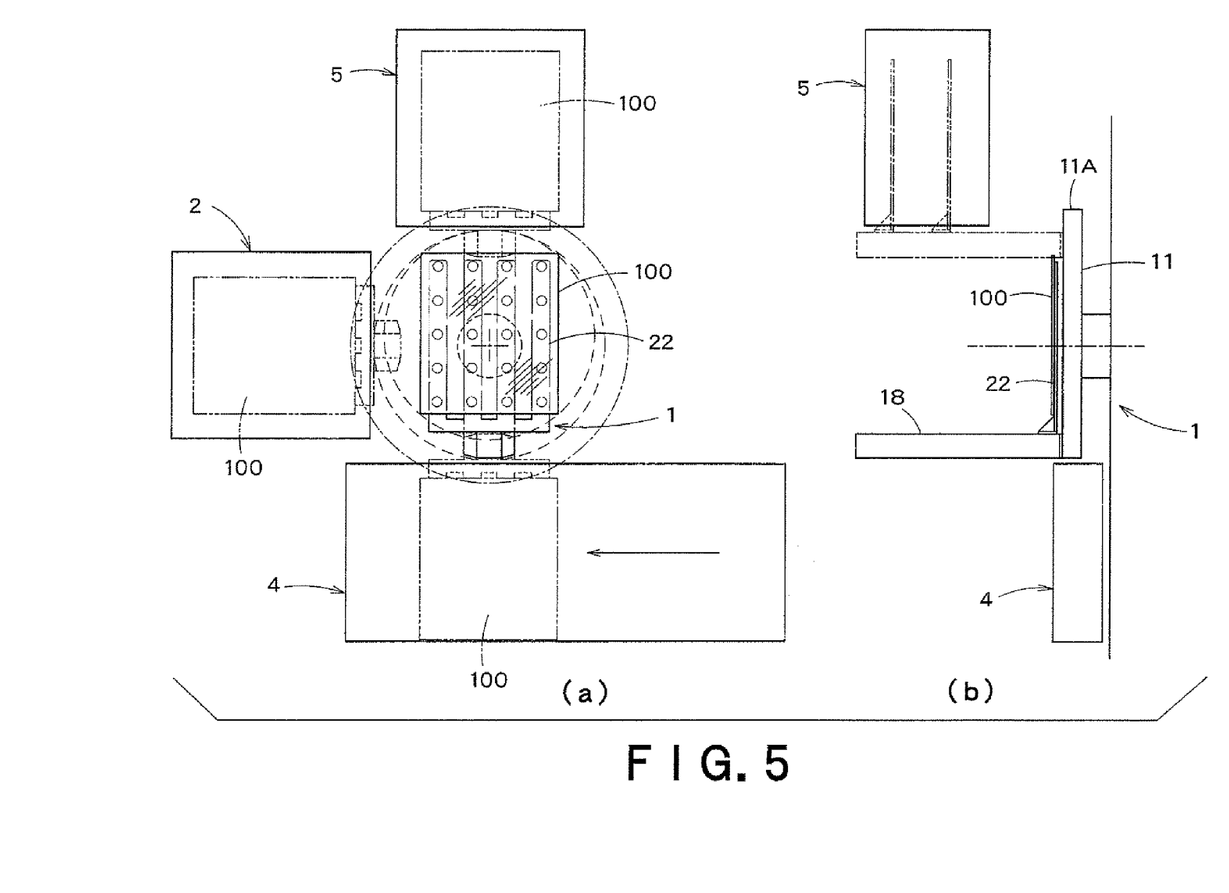
Figure 6:
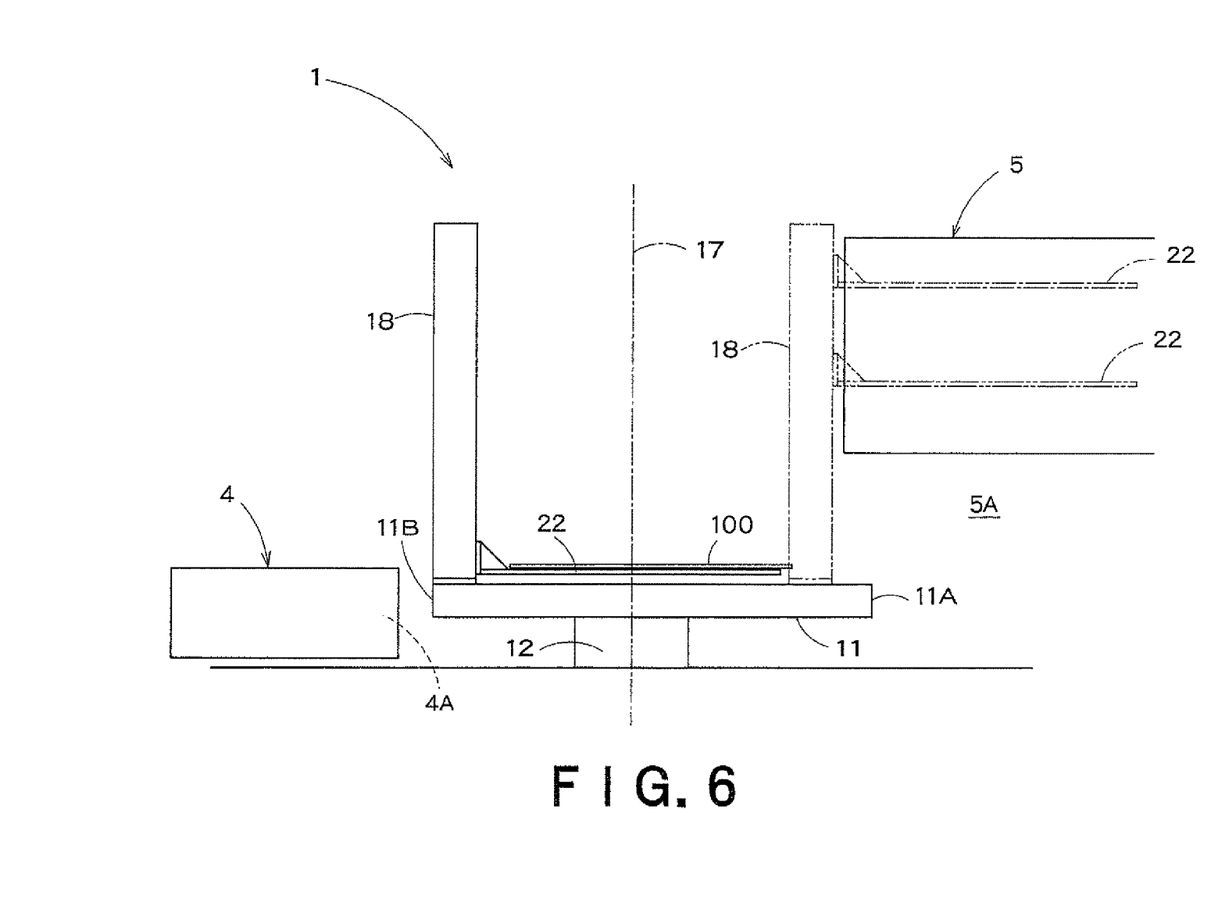
FIG. 6 is a side view provided for further illustrating the layout of the substrate transfer system and the substrate processing machine, respectively shown in FIG. 1.

Now, referring to FIGS. 5 and 6, the rotation movement of the travel support member 11 will be described in more detail. Namely, the travel support member 11 of the robot 1 is positioned at a level corresponding to each of the opened space 5A provided in the lower portion of the substrate processing machine 5 and the opened space 4A provided in the conveyor 4. Similarly, with respect to each temporary storage unit 2, 3, the travel support member 11 is positioned at the same level as that of each opened space 2A, 3A of the temporary storage units 2, 3.

Namely, with this configuration, the travel support member 11 can be rotated with its distal end 11A adequately passing through each opened space 2A, 3A, 4A, 5A, thereby preventing any interference between such the travel support member 11 and each unit or component 2 to 5.

Further, as described above, the rotation shaft 12 is positioned slightly nearer to the rear end 11B of the support member 11 than the central position in the longitudinal direction of the support member 11. Therefore, this configuration can securely prevent unwanted interference between the lifting support member 18 and each unit or component 2 to 5, even when the travel support member 11 is rotated with the lifting support member 18 being positioned at the rear end 11B of the travel support member 11.

In addition, with this configuration including the rotation shaft 12 located slightly nearer to the rear end 113 of the support member 11 relative to the central position in the longitudinal direction of the support member 11, the weight of the entire robot 1, upon its rotation or pivot movement about such a rotation shaft, can be well-balanced, providing an adequately smooth rotation movement of the robot 1.

Namely, due to the positioning of the lifting support member 18 located at the rear end 116 of the travel support member 11 during the rotation movement of this travel support member 11, as well as due to the positioning of the rotation shaft 12 for allowing a forward portion of the travel support member 11 to be somewhat longer than a rear portion thereof, the weight of the entire robot 1 can be successfully well-balanced.

While the belt and pulleys are employed in this embodiment as a direct-acting-type mechanism for constituting the aforementioned horizontal driving mechanism and vertical driving mechanism, any other suitable direct-acting-type mechanism, such as a rack and pinion type mechanism, a ball and screw type mechanism, a linear motor, a cylinder, a telescopic type mechanism, a pantograph type mechanism or the like, can also be used.

While the rotation driving mechanism in this embodiment is configured such that the driving force of the servomotor 14 can be transmitted to the travel support member 11 via the two gear mechanisms 15, 16, the travel support member 11 may be directly connected with a proper high-power motor or the like.

Now, the operation of the robot 1 in the case of transferring the glass substrate 100 on the conveyor 4 to the substrate processing machine 5 will be described.

In an initial state, as shown in FIG. 1, the end effector 22 faces the conveyor 4, while, as shown in FIG. 3, the lifting support member 18 is positioned on the side of the rear end 11B of the travel support member 11.

Then, the end effector 22 is lowered by the actuation of the servomotor 25 provided for the vertical carriage to a point lower by a predetermined distance than the level of a bottom face of the glass substrate 100 carried on the conveyor 4.

Thereafter, the lifting support member 18 is moved toward the front end 11A of the travel support member 11 by the actuation of the servomotor 21 provided for the horizontal carriage, thereby to move the end effector 22 to a point below the glass substrate 100.

Subsequently, the end effector 22 is moved upward a preset distance by the actuation of the servomotor 25 for the vertical carriage in order to allow the glass substrate 100 to be held on the end effector 22.

Then, the lifting support member 18 is moved toward the rear end 11B of the travel support member 11 by the actuation of the servomotor 21 for the horizontal carriage.

Thereafter, the travel support member 11 is rotated by the actuation of the servomotor 14 provided for the rotation drive in order to direct the end effector 22 toward the substrate processing machine 5.

Subsequently, the end effector 22 is moved upward by the actuation of the servomotor 25 for the vertical carriage to a point higher by a given distance than the level of a substrate mounting portion of the substrate processing machine 5.

Then, the lifting support member 18 is moved toward the front end 11A of the travel support member 11 by the actuation of the servomotor 21 for the horizontal carriage in order to move the end effector 22 to a point above the substrate mounting portion of the substrate processing machine 5.

Thereafter, the end effector 22 is moved downward a certain suitable distance by the actuation of the servomotor 25 for the vertical carriage in order to place the glass substrate 100 on the substrate mounting portion of the substrate processing machine 5.

Finally, the lifting support member 18 is moved to the rear end 11B of the travel support member 11 by the actuation of the servomotor 21 for the horizontal carriage.

In this embodiment, as described above, the glass substrate 100 is carried in and carried out by utilizing the conveyor 4. However, for instance, a table suitable for temporarily placing thereon the glass substrate 100 may be provided, such that the glass substrate 100 can be carried in and carried out after the substrate 100 is placed on the table by the robot or the like. Alternatively, a plurality of glass substrates 100 may be carried in and carried out as a whole, while being contained in a proper substrate container.

Further, in the substrate transfer robot 1 of this embodiment constructed as described above, the glass substrate 100 can be lifted by driving only the end effector 22 among the components of the robot 1, while being held by the end effector 22. Therefore, as compared with the related art in which other arms are moved together with the end effector in order to lift the glass substrate 100 or the like, the capacity of the servomotor necessary for constituting each driving unit can be substantially reduced. Therefore, this embodiment can successfully prevent undue increase of the size of the robot 1, while adequately controlling the production cost.

Additionally, in the substrate transfer robot 1 of this embodiment, the end effector 22 can also be moved in the horizontal direction by moving the vertical driving unit itself in the horizontal direction. Therefore, unlike the related art substrate transfer robot, it is not necessary to extend the arm in the horizontal direction. Namely, this configuration of the embodiment can securely eliminate the problem attributable to the bending caused by the extension of the arm so that, highly accurate positioning of the end effector 22 can be achieved.

In addition, according to the transfer system including the substrate transfer robot 1 of the above embodiment, each unit or component 2 to 5 can be positioned nearer to the robot 1, as compared with the robot system of the related art, while successfully preventing the interference between the travel support member 11 of the robot 1 and each unit or component 2 to 5. Therefore, this invention can enable a more compact layout to be employed for the entire system including the substrate processing machine 5.

While one preferred embodiment has been shown and described above, it will be understood that there is no intent to limit the scope of the present invention by such disclosure, and that various alterations and modifications can be made to this embodiment without departing from the spirit and scope of the invention. Namely, it will be obvious that the intention in the appended claims is to cover all such alterations and modifications as may fall within the true scope of the invention.

The invention claimed is:

1. A substrate transfer system comprising:
   a substrate transfer robot configured to transfer a substrate to/from a substrate processing machine located adjacent to the substrate transfer robot for processing the substrate;
   a substrate carrying in/out unit located adjacent to the substrate transfer robot and configured to carry in the substrate to a position near the substrate transfer robot as well as carry out the substrate received from the substrate transfer robot; and a temporary storage unit located adjacent to the substrate transfer robot and configured to temporarily store therein the substrate transferred by the substrate transfer robot between the substrate carrying in/out unit and the substrate processing machine, wherein the substrate transfer robot includes an end effector configured to hold a substrate in a substantially horizontal state;

a vertical driving unit configured to drive the end effector to move in a vertical direction;

a horizontal driving unit configured to drive the vertical driving unit to move in a horizontal direction; and a rotation driving unit configured to rotate the horizontal driving unit about a rotation axis extending in the vertical direction, one end of the vertical driving unit is connected with the horizontal driving unit, the rotation axis is positioned nearer to a rear end of the horizontal driving unit than a central position thereof in a longitudinal direction of the horizontal driving unit, the end effector extends in the horizontal direction and has a proximal end and a distal end, the proximal end of the end effector being attached to the vertical driving unit, the substrate transfer robot is configured such that when the vertical driving unit is positioned at a rear end of the horizontal driving unit, the distal end of the end effector and a distal end of the substrate held on the end effector are positioned on a rear end side relative to a front end of the horizontal driving unit and nearly on the front end of the horizontal driving unit, and the rotation axis is positioned nearly on a central position of the end effector in the horizontal direction and nearly on a central position of the substrate held on the end effector in the horizontal direction, an opened space, which is opened at least on a side facing the substrate transfer robot, is provided in a lower portion of at least one of the substrate processing machine and the temporary storage unit, and the substrate transfer robot is positioned such that when the horizontal driving unit is rotated about the rotation axis, the front end of the horizontal driving unit passes through at least one opened space.

2. The substrate transfer system according to claim 1, wherein the substrate processing machine and the substrate carrying in/out unit are arranged to be opposed relative to each other with the substrate transfer robot being positioned therebetween, and wherein the temporary storage unit is positioned on a line orthogonal to a line defined between the substrate processing machine and the substrate carrying in/out unit.

3. The substrate transfer system according to claim 2, wherein a pair of temporary storage units are arranged to be opposed relative to each other with the substrate transfer robot being positioned therebetween.

4. The substrate transfer system according to claim 1, wherein the horizontal driving unit includes a travel support member extending in the horizontal direction, the travel support member having a front end and a rear end and being configured to be rotated about the rotation axis by the rotation driving unit, and a travel driving mechanism configured to drive the vertical driving unit to travel between the front end and the rear end of the travel support member, and wherein the travel driving mechanism includes a horizontal transfer belt provided across the front end and the rear end of the travel support member, a bottom end of the vertical driving unit being fixedly attached to the horizontal transfer belt, and a horizontal transfer motor configured to drive the horizontal transfer belt.

5. The substrate transfer system according to claim 1, wherein the vertical driving unit includes a lifting support member extending in the vertical direction and having a top end and a bottom end, the bottom end of the lifting support member being attached to the horizontal driving unit, and a lifting driving mechanism configured to lift the end effector between the top end and the bottom end of the lifting support member, and wherein the lifting driving mechanism includes a vertical transfer belt provided across the top end and the bottom end of the lifting support member, a proximal end of the end effector being fixedly attached to the vertical transfer belt, and a vertical transfer motor configured to drive the vertical transfer belt.

* * * * *